US012740464B2

(12) United States Patent
Fatahilah

(10) Patent No.: US 12,740,464 B2
(45) Date of Patent: Sep. 15, 2026

(54) LASER TRANSFER OF MICROELECTRONIC DEVICE AND ASSOCIATED CONDUCTIVE PAD

(71) Applicant: Coherent LaserSystems GmbH & Co. KG, Göttingen (DE)

(72) Inventor: Muhammad Fatahilah, Göttingen (DE)

(73) Assignee: Coherent LaserSystems GmbH & Co. KG, Göttingen (DE)

( * ) Notice: Subject to any disclaimer, the term of this patent is extended or adjusted under 35 U.S.C. 154(b) by 399 days.

(21) Appl. No.: 18/517,714

(22) Filed: Nov. 22, 2023

(65) Prior Publication Data

US 2025/0167170 A1 May 22, 2025

(51) Int. Cl.
*H10W 72/00* (2026.01)
*H10W 72/30* (2026.01)

(52) U.S. Cl.
CPC ......... *H10W 72/073* (2026.01); *H10W 72/30* (2026.01); *H10W 72/01365* (2026.01); *H10W 72/07331* (2026.01); *H10W 72/07335* (2026.01); *H10W 72/325* (2026.01); *H10W 72/352* (2026.01); *H10W 72/353* (2026.01)

(58) Field of Classification Search
None
See application file for complete search history.

(56) References Cited

U.S. PATENT DOCUMENTS

2010/0258543 A1* 10/2010 Mizuno .................. H10P 34/42 219/121.72
2020/0075560 A1 3/2020 Zou et al.
2020/0187803 A1* 6/2020 Komatsu ................ A61B 5/352
2022/0029051 A1 1/2022 Lin et al.
2022/0380901 A1* 12/2022 Zergioti ............. B23K 26/0006
2023/0290664 A1* 9/2023 Sterken ................... H10P 72/74
2024/0162405 A1* 5/2024 Noda ..................... H10H 20/80

FOREIGN PATENT DOCUMENTS

WO WO-2020152352 A1 7/2020
WO WO-2020197105 A1 10/2020
WO WO-2022202945 A1 9/2022

OTHER PUBLICATIONS

International Search Report and Written Opinion received for International Patent Application No. PCT/EP2024/083101 mailed on Feb. 20, 2025, 12 pages.

(Continued)

*Primary Examiner* — Nduka E Ojeh
(74) *Attorney, Agent, or Firm* — TraskBritt

(57) ABSTRACT

A laser transfer method includes transferring a pad of conductive paste from a conductive-paste layer on a first donor substrate to a receiver substrate by laser-induced forward transfer, and transferring a microelectronic device from a second donor substrate to the pad of conductive paste on the receiver substrate by laser-induced forward transfer. The two steps of laser-induced forward transfer may be performed in the same laser-based machine. The presently disclosed method is applicable to the manufacture of microLED displays. In this context, the disclosed method may yield significant cost reductions, at least by virtue of requiring fewer processing steps and tools than conventional schemes.

20 Claims, 7 Drawing Sheets

(56) References Cited

OTHER PUBLICATIONS

Morales et al., (2015). "High volume transfer of high viscosity silver pastes using Laser Direct-Write Processing for metallization of c-Si cells," Proc. of SPIE, 93510:B1-B7.
Munoz-Martin et al., (2016). "Laser-induced forward transfer of high-viscosity silver pastes," Applied Surface Science, 366:389-396.
Shan et al., (2019). "Laser direct printing of solder paste," AIP Advances, 9:125306, 7 pages.

* cited by examiner

LASER TRANSFER OF MICROELECTRONIC DEVICE AND ASSOCIATED CONDUCTIVE PAD

TECHNICAL FIELD

The present disclosure relates in general to laser-induced inter-substrate transfer of microelectronic devices onto a final substrate where the microelectronic devices are to be connected to electronic circuitry. The present disclosure relates, in particular, to the transfer of micro-light-emitting-diodes (microLEDs) to a backplane of a display assembly.

BACKGROUND

Consumers are continuously demanding thinner and lighter electronic devices with higher performance, such as thinner displays with higher resolution. To meet these demands, the microelectronics industry is pushing toward making ever smaller microelectronic devices. For example, microLEDs less than 70 microns×70 microns in size and as small as about 3 microns×3 microns are being developed for the purpose of making high-resolution LED displays. Such microLED displays are an emerging display technology expected to offer higher brightness, lower power consumption, and faster response than organic LED displays and liquid-crystal displays.

Wafer-level manufacturing has long been the most cost-effective mass-production method for microelectronic devices, with the capability to manufacture millions of identical microelectronic devices simultaneously on the same wafer. In this context, laser processing has several attractive properties such as non-contact mode of operation, selective and flexible application, and more easily managed environmental hazards than wet chemistry processing.

Although it is possible in at least some situations to separate out individual microelectronic devices from a wafer by dicing the wafer, thinner form factors may be achieved by instead detaching the microelectronic devices from the wafer. Therefore, wafer-level manufacturing of microelectronic devices may involve one or more steps of detaching the microelectronic devices from a substrate. When the microelectronic devices are in place on the substrate of the final system, such as a display backplane, electrical connections are required to make the microelectronic devices functional.

Consider a typical process for making microLED displays. In this process, red, green, and blue microLEDs are grown at high density on three respective wafers and then transferred to a common display backplane in an interleaved pattern to form color pixels. The transfer from the growth wafer to the display backplane may be direct, or indirect via one or more intermediate wafers. Before transferring the microLEDs to the display backplane, "solder bumps" are printed on the display backplane and subjected to reflow. The display backplane is then stored until the process of transferring the microLEDs to the display backplane is performed in a pick-and-place machine. The pick-and-place machine positions each microLED on a reflowed solder bump. A reflowed solder bump is a solder bump that has been heated to a molten state. Reflow is usually performed in a reflow oven. Once all microLEDs have been transferred to the display backplane in this manner, the solder bumps are cured to complete an electrical connection from electronic circuitry incorporated in the display backplane to the backside of each microLED. Subsequently, electrical connections to the front sides of the microLEDs are produced, for example, using lithographic deposition or printing techniques.

Laser lift-off has emerged as a promising technology for transfer of microelectronic devices between two substrates. The laser lift-off process releases a microelectronic device from the donor substrate by laser ablating an intervening layer, such as gallium nitride, located between the donor substrate and the microelectronic device. Laser lift-off typically utilizes ultraviolet light generated by an excimer laser, and a microelectronic device may be released from a substrate by a single laser pulse. Using laser lift-off, the entire transfer process may be laser-mediated. In a bond-release scheme, the microelectronic devices are bonded to the receiver substrate before being released from the donor substrate by laser ablation of the intervening layer. In a laser-induced forward transfer (LIFT) scheme, the receiver substrate is held a distance away from the microelectronic devices, and the laser ablation of the intervening layer not only releases the microelectronic devices from the donor substrate but also propels the microelectronic devices across the gap to the receiver substrate. The greater distance between the donor and receiver substrates in LIFT may be advantageous or even required when transferring microelectronic devices to a receiver substrate that already contains other elements, e.g., already-deposited microelectronic devices. This situation is encountered during the initial positioning of the microLEDs on a display backplane of a microLED display, for example when red microLEDs are transferred to a microLED display backplane that already contains green and blue microLEDs. This situation is also encountered during repair processes that replace individual faulty microLEDs on the microLED display backplane.

BRIEF SUMMARY

Disclosed herein is a laser transfer method that uses LIFT to transfer not only microelectronic devices but also associated conductive pads. LIFT is first used to transfer pads of conductive paste from one donor substrate to a receiver substrate. LIFT is then also used to transfer microelectronic devices from another donor substrate onto the receiver substrate. Each microelectronic device is positioned on a corresponding pad of conductive paste that electrically connects the backside of the microelectronic device to the substrate.

As compared to conventional schemes, the presently disclosed laser transfer method reduces the number of steps and the number of tools required to affix the microelectronic devices on the receiver substrate. In a typical conventional scheme, the receiver substrate is subjected to (1) solder-bump printing in a solder-paste printer, (2) reflow in a reflow soldering machine, (3) storage in a storage device, and (4) microelectronic-device transfer in a pick-and-place apparatus, before the solder bumps can be cured and the assembly can be forwarded to inspection and frontside processing. Thus, in this conventional scheme, the receiver substrate is subjected to four steps requiring four different respective tools before the process of curing the solder bumps. The method disclosed herein replaces these four steps with two LIFT steps. These two LIFT steps may be performed in the same laser-based machine, thereby replacing four different tools with a single tool.

The presently disclosed method is applicable to the manufacture of microLED displays. In this context, the disclosed method may yield significant cost reductions, at least by virtue of requiring fewer processing steps and tools than conventional schemes.

In one aspect of the invention, a laser transfer method includes steps of transferring a pad of conductive paste from a conductive-paste layer on a first donor substrate to a receiver substrate by laser-induced forward transfer, and transferring a microelectronic device from a second donor substrate to the pad of conductive paste on the receiver substrate by laser-induced forward transfer.

BRIEF DESCRIPTION OF THE DRAWINGS

The accompanying drawings, which are incorporated in and constitute a part of the specification, schematically illustrate preferred embodiments of the present disclosure, and together with the general description given above and the detailed description of the preferred embodiments given below, serve to explain principles of the present disclosure.

DETAILED DESCRIPTION

Figure 1:
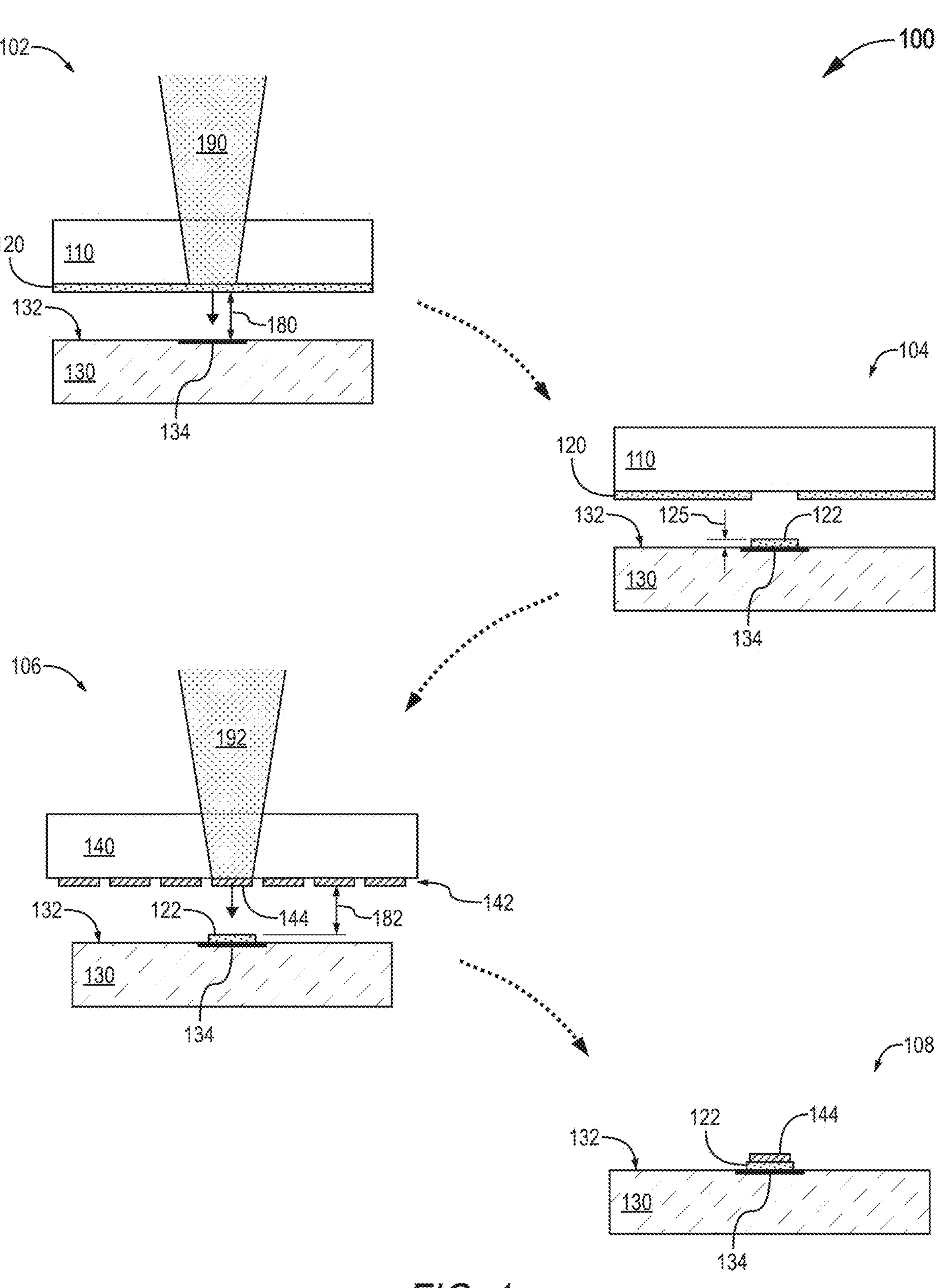
FIG. 1 illustrates a method for laser transfer of a microelectronic device onto a receiver substrate, according to an embodiment. This method uses LIFT to transfer both the microelectronic device and a corresponding pad of conductive paste to the receiver substrate.

Referring now to the drawings, wherein like components are designated by like numerals, FIG. 1 illustrates one method 100 for laser transfer of a microelectronic device 144 onto a receiver substrate 130. Method 100 uses LIFT to transfer both device 144 and a corresponding pad 122 of conductive paste to receiver substrate 130. In one scenario, device 144 is a microLED, and receiver substrate 130 is a backplane for a microLED display. The conductive paste of pad 122 is a viscous, electrically-conductive slurry and may include metal particles and a solvent. The metal particles may include or consist of silver, and may be in the form of nanoparticles. The solvent may be volatile.

FIG. 1 illustrates method 100 through a series of diagrams 102, 104, 106, and 108. First, method 100 uses LIFT to transfer pad 122 from a conductive-paste layer 120 on a donor substrate 110 to receiver substrate 130, as illustrated in diagrams 102 and 104. Next, method 100 uses LIFT to transfer device 144 from a donor substrate 140 to pad 122 on receiver substrate 130.

The LIFT step used to transfer pad 122 from donor substrate 110 to receiver substrate 130 includes arranging donor substrate 110 such that (a) conductive-paste layer 120 faces a receiving surface 132 of receiver substrate 130 and (b) there is a gap 180 between conductive-paste layer 120 and receiving surface 132, as shown in diagram 102. Once donor substrate 110 and receiver substrate 130 are arranged in this manner, method 100 directs a laser beam 190 through donor substrate 110 onto conductive-paste layer 120. The resulting irradiation of conductive-paste layer 120 by laser beam 190 releases a portion of conductive-paste layer 120 from donor substrate 110 and propels this portion across gap 180 onto receiver substrate 130 to form pad 122, as shown in diagram 104.

Receiving surface 132 may be planar or non-planar. If receiving surface 132 is non-planar, for example a planar surface with elements protruding therefrom, donor substrate 110 may be arranged such that conductive-paste layer 120 does not contact any portion of receiving surface 132. In most scenarios, at least the portion of receiving surface 132 that is to receive pad 122 is planar.

The LIFT step used to transfer device 144 from donor substrate 140 to receiver substrate 130 includes arranging donor substrate 140 such that (a) device 144 faces pad 122 on receiving surface 132 of receiver substrate 130 and (b) there is a gap 182 between device 144 and pad 122, as shown in diagram 106. In the event that receiving surface 132 and/or donor substrate 140 contain protruding elements, other than pad 122 and device 144, gap 182 may be sized to prevent contact or interference between such elements. Next, method 100 directs a laser beam 192 through donor substrate 140 toward device 144. Irradiation of device 144 by laser beam 192 releases device 144 from donor substrate 140 and propels device 144 across gap 182 to pad 122 on receiver substrate 130.

Each of laser beams 190 and 192 may be an ultraviolet laser beam, that is, a laser beam with a wavelength in the range between 100 and 400 nanometers. This ultraviolet laser beam may be pulsed, and each of the two LIFT steps of method 100 may be achieved by a single respective laser pulse. The two LIFT steps of method 100 may be performed by the same laser apparatus, even using the same laser source. In such scenarios, receiver substrate 130 may remain in a laser processing chamber of this laser apparatus between the two LIFT steps. This provides for an efficient and simple transfer process, and allows for a minimal time delay between the two processing steps. For example, the delay between the two processing steps may be less than 15 minutes when the task of replacing donor substrate 110 with donor substrate 140 is performed manually, and even less when performed by a robot. Whether or not the same laser source is used for both LIFT steps, the parameters of the laser beam used for LIFT of pad 122 may differ from those used for LIFT of device 144. For example, the laser intensity used for LIFT of device 144 may exceed the laser intensity used for LIFT of pad 122.

Receiving surface 132 may include an electrical contact 134 where method 100 deposits pad 122, such that pad 122 is in physical contact with contact 134 and thereby electrically connects contact 134 to the side of device 144 facing receiving surface 132. Contact 134 may include or consist of metal. Receiver substrate 130 may include additional electronic circuitry configured to operate device 144, at least partly through the electrical connection provided by pad 122 and contact 134. Contact 134 may be larger than pad 122, as shown in FIG. 1. Alternatively, contact 134 may be smaller than pad 122, and/or pad 122 may be only partly located on contact 134.

In certain scenarios, method 100 eliminates the need for reflow of pad 122 between LIFT of pad 122 and LIFT of device 144. In one such scenario, the two LIFT steps of method 100 are performed in quick succession, for example in the same laser-based machine. In another such scenario, the paste material of pad 122 is configured to stay soft for an extended duration, unless actively cured. In one example, pad 122 may stay soft for up to 24 hours, thus allowing for a delay between the two LIFT steps of up to 24 hours without having to subject pad 122 to reflow. In another example, method 100 performs the two LIFT steps with a delay therebetween of no more than 8 hours or no more than 90 minutes. In one embodiment of method 100, pertaining to these no-reflow scenarios, the temperature of pad 122 is kept below the reflow-temperature of pad 122 between the two LIFT steps. For example, the temperature of pad 122 may be kept at room temperature, or below 100 degrees Celsius, between the two LIFT steps. In this embodiment, LIFT of device 144 may be performed at least 5 minutes after LIFT for pad 122, e.g., between 5 minutes and 8 hours after LIFT of pad 122.

Figure 2:
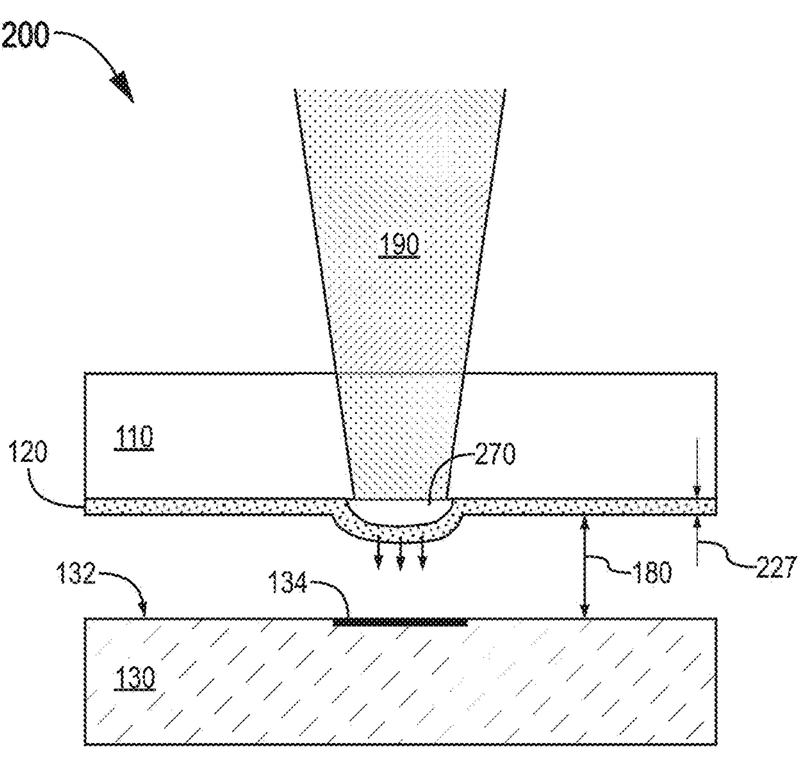
FIG. 2 illustrates a LIFT method for transferring a portion of a conductive-paste layer from a donor substrate to a receiver substrate to form a conductive pad on the receiver substrate, according to an embodiment.

FIG. 2 illustrates one LIFT method 200 for transferring a portion of conductive-paste layer 120 from donor substrate 110 to receiver substrate 130. Method 200 is an embodiment of the LIFT step of method 100 used to transfer pad 122 (see diagrams 102 and 104 of FIG. 1). In method 200, laser beam 190 locally evaporates some of conductive-paste layer 120. For example, laser beam 190 may evaporate some of a solvent included in conductive-paste layer 120. This evaporation leads to the formation of a bubble 270 at the interface between donor substrate 110 and conductive-paste layer 120, at the location where laser beam 190 is incident on conductive-paste layer 120. Bubble 270 pushes a portion of conductive-paste layer 120 away from donor substrate 110. As laser beam 190 continues to locally evaporate conductive-paste layer 120, bubble 270 expands and ultimately forces a portion of conductive-paste layer 120 across gap 180 onto receiver substrate 130, where this portion of conductive-paste layer 120 forms pad 122.

The exact manner in which the transferred portion of conductive-paste layer 120 is forced across gap 180 to receiver substrate 130 depends on various parameters, such as the viscosity and thickness of conductive-paste layer 120, the size of gap 180, and the intensity of laser beam 190. In one example, growth of bubble 270 leads to fragmentation of conductive-paste layer 120 and the resulting fragments are propelled across gap 180 onto receiving surface 132. In another example, conductive-paste layer 120 remains intact until touching receiving surface 132, whereafter a single contiguous portion of conductive-paste layer 120 separates from the remaining conductive-paste layer 120 and forms a single contiguous pad 122. This separation of the single contiguous pad 122 may require increasing the size of gap 180 after the initial contact between conductive-paste layer 120 and receiving surface 132. Although diagram 104 of FIG. 2 shows a complete absence of conductive-paste material at the location on donor substrate 110 from which pad 122 is taken, some conductive paste may remain at this location.

In certain implementations of method 200, found to produce clean pads 122, the thickness 227 of conductive-paste layer 120 is in the range between 5 and 25 micrometers (μm), the viscosity of conductive-paste layer 120 is at least 25000 centipoise, gap 180 is in the range between 50 and 500 μm, laser beam 190 is ultraviolet, and laser beam 190 is incident on conductive-paste layer 120 with an intensity in the range between 100 and 500 millijoules per square-centimeter (mJ/cm$^2$) or in the range between 200 and 500 mJ/cm$^2$. The thickness 125 (indicated in diagram 104 of FIG. 1) of the resulting pad 122 may be in the range between 2 and 20 μm.

Figure 3:
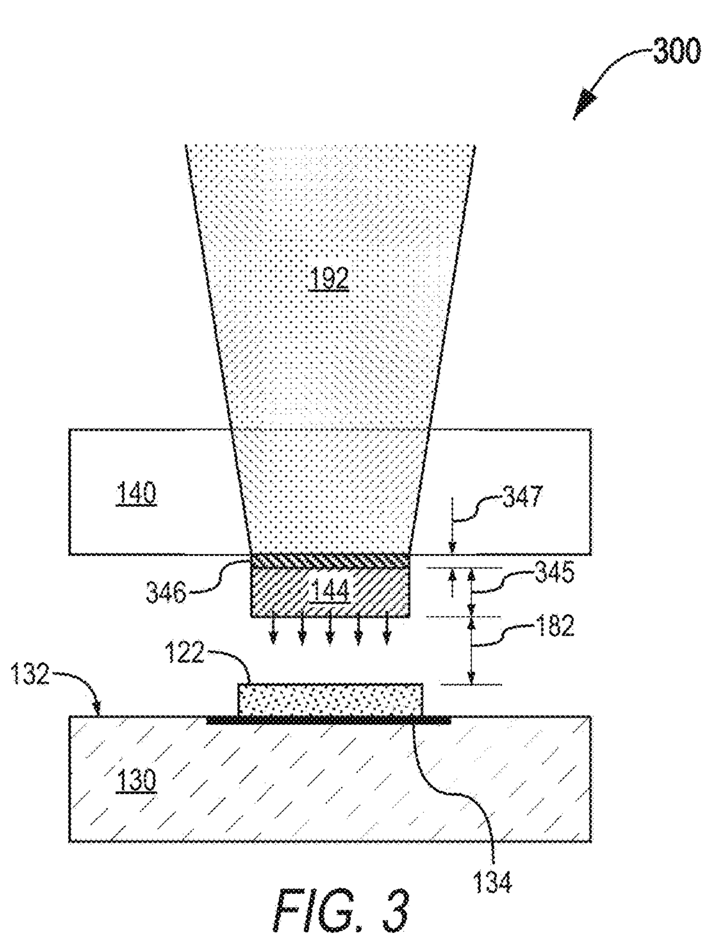
FIG. 3 illustrates a LIFT method for transferring a microelectronic device from a donor substrate to a pad of conductive paste on a receiver substrate, according to an embodiment.

FIG. 3 illustrates one LIFT method 300 for transferring device 144 from donor substrate 140 to pad 122 on receiver substrate 130. This pad 122 may have been deposited on receiver substrate 130 using method 200. Method 300 is an embodiment of the LIFT step of method 100 used to transfer device 144 (see diagrams 106 and 108 of FIG. 1). In method 300, laser beam 192 ablates an intervening layer 346 at the interface between donor substrate 140 and device 144. Layer 346 may include or consist of gallium nitride. In one implementation, layer 346 is distinct from device 144. For example, the material composition of layer 346 may be different from that of the adjacent portion of device 144. In another implementation, layer 346 is a sacrificial layer of device 144, indistinct in material composition from the adjacent portion of device 144. Ablation of layer 346 releases device 144 from donor substrate 140 and propels device 144 toward receiver substrate 130. Donor substrate 140 and receiver substrate 130 are arranged relative to each other such that device 144 lands on pad 122. The propelling of device 144 across gap 182 may be at least in part caused by expansion of gas generated by the ablation process.

Gap 182 may be at least 50 μm, for example, in the range between 50 and 500 μm. The height 345 of device 144 may be in the range between 3 and 7 μm. The thickness 347 of layer 346 may be less than 2 μm. The deposition of device 144 on pad 122 may displace some material of pad 122, thereby thinning at least a portion of pad 122. Laser beam 192 may be ultraviolet and be incident on layer 346 with an intensity in the range between 500 and 2000 mJ/cm$^2$ or in the range between 750 and 1300 mJ/cm$^2$.

Figure 4A:
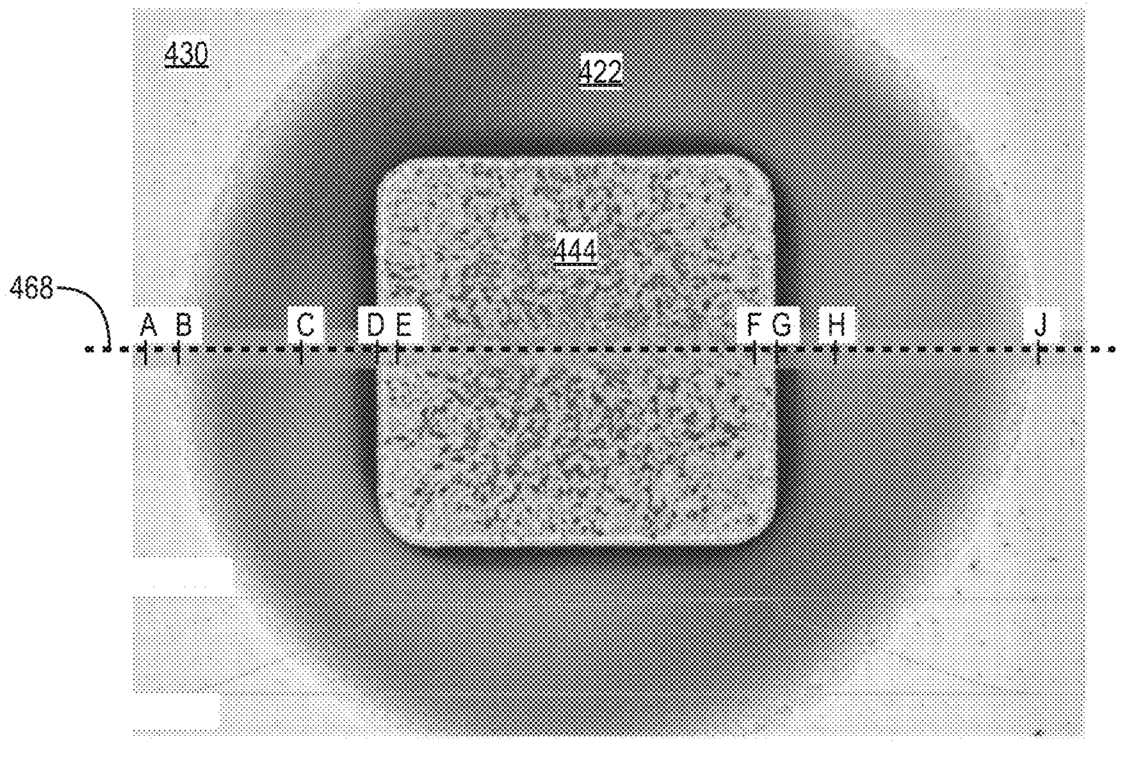
FIGS. 4A and 4B show an example of a pad of conductive paste and associated microelectronic device as deposited on a receiver substrate according to the method of FIG. 1.
Figure 4B:
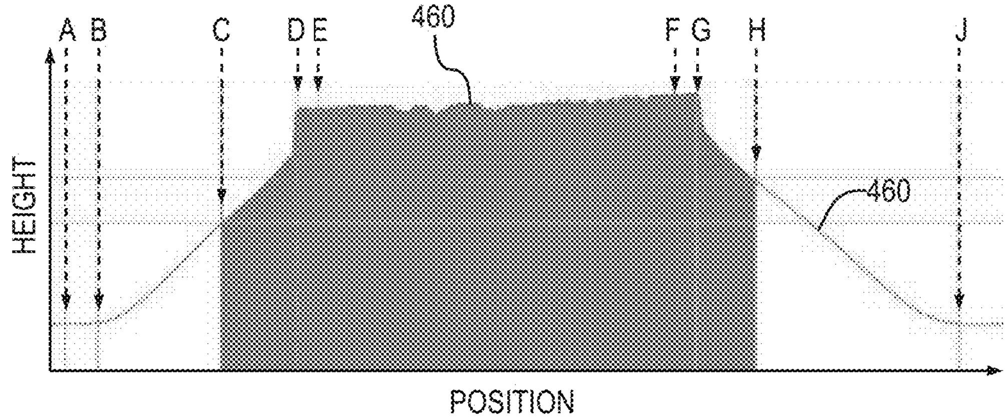

FIGS. 4A and 4B show a pad 422 and a microelectronic device 444 as deposited on a receiver substrate 430 according to method 100. Pad 422, device 444, and receiver substrate 430 are examples of pad 122, device 144, and receiver substrate 130, respectively. Pad 422 is a pad of silver paste approximately circular in shape, and device 444 is a square microLED with rounded corners. The silver paste of pad 422 includes silver particles. FIG. 4A is a microscope image of pad 422, device 444, and receiver substrate 430 from above. FIG. 4B is a height profile 460 taken along line 468 in FIG. 4A. In FIG. 4A, letters A, B, C, D, E, F, G, H, and J indicate selected positions along line 468. These selected positions are shown in FIG. 4B as well.

Pad 422 spans between positions B and J, corresponding to a diameter of approximately 85 μm. Pad 422 was transferred to receiver substrate 430 using method 200. Device 444 has a width of 40 μm, spans between positions D and G, and was transferred to receiver substrate 430 using method 300. As seen in FIG. 4A, pad 422 is contiguous with a well-defined perimeter, and device 444 is entirely within the perimeter of pad 422. FIG. 4B shows that device 444 sits level on pad 422.

Method 100 is not limited to the shapes of pads and microelectronic devices shown in FIGS. 1-4B. For example, pad 122 may be approximately rectangular or square, and device 144 may be approximately circular or non-square rectangular. The sizes of pad 122 and device 144 may also differ from those of the example provided in FIGS. 4A and 4B. In one embodiment, the width of each of pad 122 and device 144 is in the range between 5 and 60 μm. Herein, the "width" of pad 122, or device 144, refers to the distance across the pad, or device, between two opposite locations on its perimeter. For example, the "width" may be a diameter of a circle or a diagonal-length of a rectangle.

Referring again to method 100 of FIG. 1, method 100 may further include curing pad 122 after completion of the two LIFT steps depicted in FIG. 1. In one embodiment, this curing process includes raising the temperature of pad 122 to at least partly evaporate a solvent of the conductive paste of pad 122. Even if pad 122 includes a volatile solvent, heating may accelerate the evaporation thereof. Heating may take place in an oven or, alternatively, be effected radiatively, for example using laser radiation (e.g., green laser light), or flashlamp radiation. The temperature and duration required to sufficiently evaporate the solvent in this thermal curing process depends on the properties of pad 122, including its material composition and thickness. In one example, sufficient solvent evaporation is achieved by heating pad 122 to at least approximately 100 degrees Celsius for one or several minutes, e.g., between 3 and 10 minutes. In another embodiment, the curing process includes raising the temperature of pad 122 to sinter metal particles thereof. Sintering may require heating pad 122 to at least 200 degrees Celsius for at least 20 minutes. Sintering may be accompanied by solvent evaporation, if pad 122 contains solvent. Vapors released during the curing process may be exhausted to avoid contaminating devices 144.

In the embodiment of method 100 depicted in FIG. 1, donor substrate 140 includes an array 142 of devices 144, and one of these devices 144 is to transferred to pad 122. However, method 100 is applicable to mass transfer scenarios. That is, method 100 may be used to transfer a plurality of pads 122 from donor substrate 110 to receiver substrate 130 and/or transfer a plurality of devices 144 from donor substrate 140 to respective pads 122 on receiver substrate 130. Such mass transfers may be effected using any one of several different techniques, for example as discussed in the following.

In one example of mass transfer, hereinafter referred to as "sequential transfer," laser beam 190 sequentially irradiates a plurality of mutually-separated portions of conductive-paste layer 120 to transfer a plurality of corresponding pads 122 to receiver substrate 130. In another example, hereinafter referred to as "simultaneous transfer," laser beam 190 is a larger laser beam masked to simultaneously irradiate a plurality of mutually-separated portions of conductive-paste layer 120 to effect their transfers simultaneously. A third example, hereinafter referred to as "hybrid transfer," combines sequential and simultaneous transfer. In this example, laser beam 190 is a masked, larger laser beam that is applied sequentially to different non-overlapping areas of conductive-paste layer 120. In each area, the masked, larger laser beam simultaneously irradiates a plurality of mutually-separated portions of conductive-paste layer 120 to transfer a respective plurality of pads 122. Each of the sequential-transfer, simultaneous-transfer, and hybrid-transfer techniques may be configured to transfer all the pads 122, deemed necessary for any given application, from a single donor substrate 110 to receiver substrate 130. Similar mass-transfer techniques may be applied to devices 144, with consideration to any differences between the density of devices 144 on donor substrate 140 and the desired density of devices 144 on receiver substrate 130.

Figure 5A:
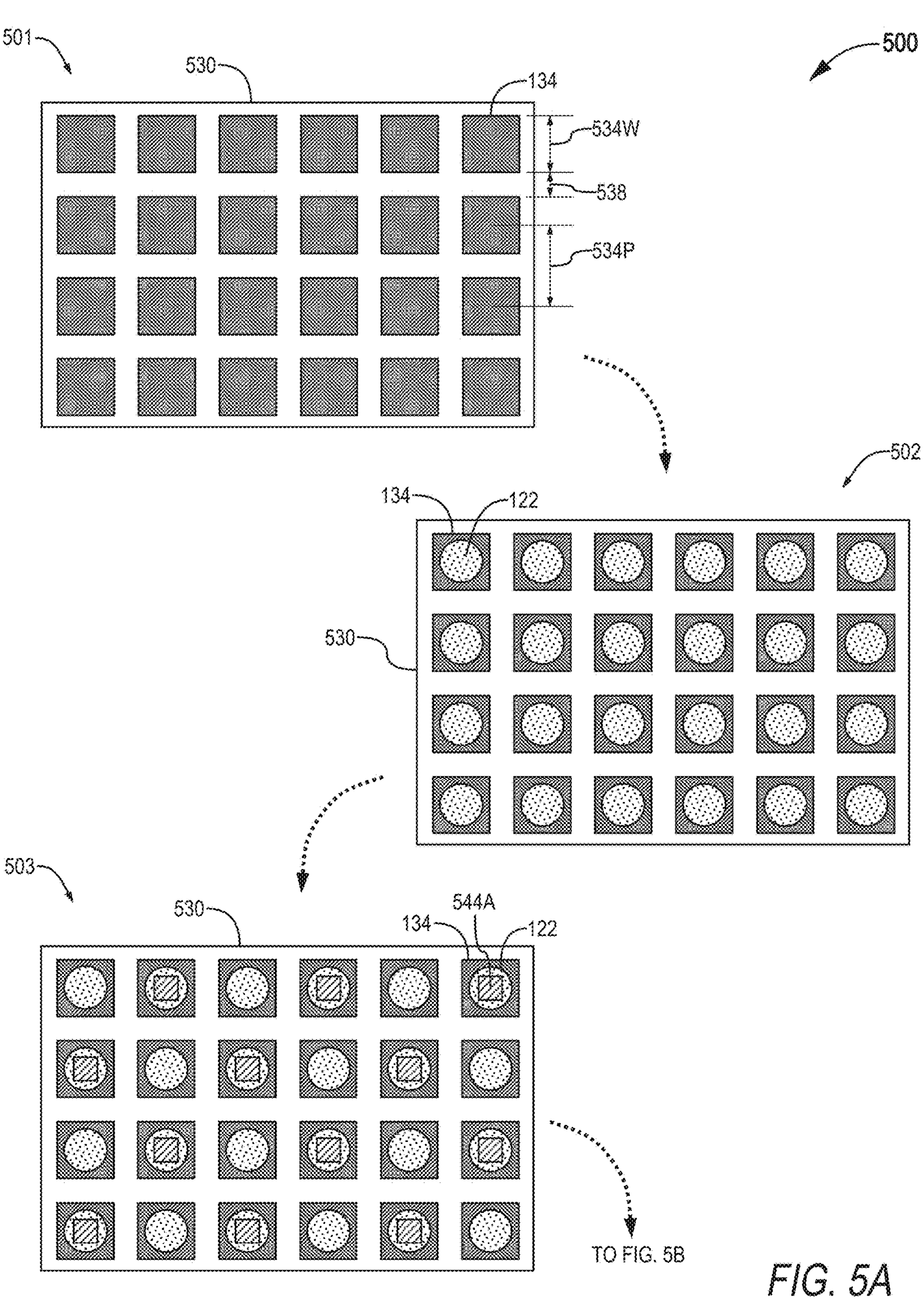
FIGS. 5A and 5B illustrate a method for mass transfer of conductive pads and microelectronic devices using LIFT, according to an embodiment. This method is an extension of the method of FIG. 1 applied to a plurality of conductive pads and a plurality of microelectronic devices.
Figure 5B:
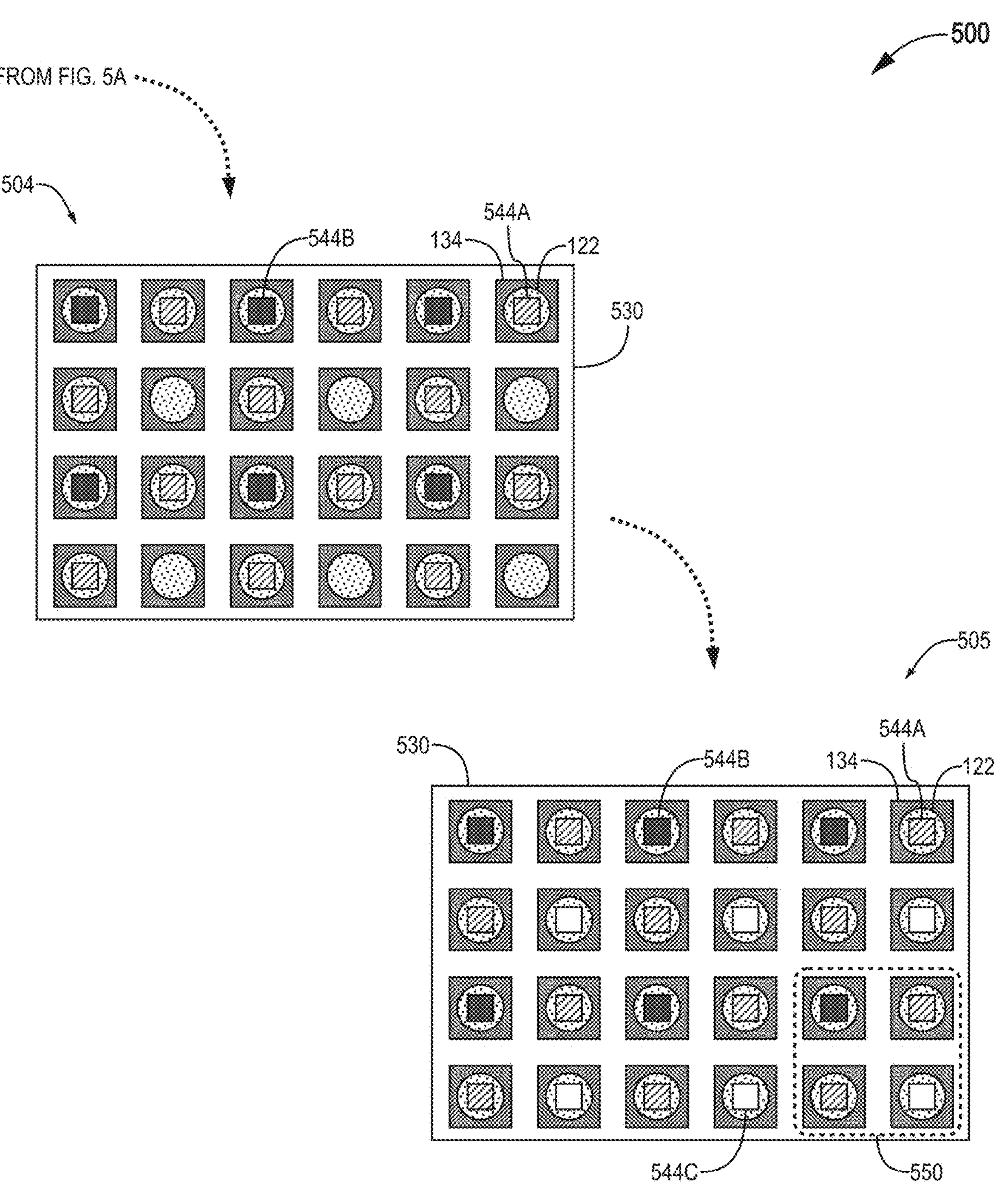

FIGS. 5A and 5B illustrate one method 500 for mass transfer of conductive pads and microelectronic devices using LIFT. Method 500 is an extension of method 100 applied to a plurality of conductive pads and a plurality of microelectronic devices. Method 500 is illustrated through a series of diagrams: diagrams 501, 502, and 503 of FIG. 5A, and diagrams 504 and 505 of FIG. 5B. Method 500 is configured to transfer three different types of microelectronic devices to the receiver substrate. Method 500 is thus suitable for manufacture of microLED displays having microLEDs of three different colors.

Method 500 transfers pads 122 and devices 144 to a receiver substrate 530 that includes an array of electrical contacts 134 (see diagram 501). Receiver substrate 530 is an embodiment of receiver substrate 130. Contacts 134 are arranged in a regular array with a pitch 534P between adjacent contacts 134. The width 534W of contacts 134 is less than pitch 534P, such that adjacent contacts 134 are separated by a gap 538.

Using LIFT, as discussed above in reference to FIG. 1, and optionally FIG. 2, method 500 transfers a pad 122 to each contact 134 on receiver substrate 530 (see diagram 502). In the depicted embodiment, each pad 122 is entirely within the perimeter of the corresponding contact 134, and no pad 122 touches another pad 122. In an alternative embodiment, one, some, or all of pads 122 extend beyond the corresponding contacts 134, without any pads 122 touching each other.

After transferring pads 122 to receiver substrate 530, method 500 uses LIFT, as discussed above in reference to FIG. 1, and optionally FIG. 3, to transfer a plurality of microelectronic devices 544A to receiver substrate 530 (see diagram 503). Devices 544A are examples of device 144. Each device 544A is positioned on a respective pad 122. However, not all pads 122 receive a device 544A. The unoccupied pads 122 may instead receive other types of devices in subsequent LIFT steps. Each device 544A may have a smaller footprint than the corresponding pad 122 on receiver substrate 530 and be located entirely inside the perimeter of pad 122, as depicted in FIGS. 5A and 5B. In other implementations, however, the footprint of each of one or more of devices 544A exceeds that of the corresponding pad 122 and/or falls outside pad 122.

Next, method 500 transfers a second set of microelectronic devices 544B to some but not all the unoccupied pads 122 on receiver substrate 530 (see diagram 504). Devices 544B are transferred from a different donor substrate than the donor substrate providing devices 544A. Method 500 then proceeds to transfer a third set of microelectronic devices 544C to remaining unoccupied pads 122 on receiver substrate 530 (see diagram 505). All remaining unoccupied pads 122 may receive a device 544C. Devices 544C are transferred from a different donor substrate than the donor substrates providing devices 544A and 544B. The transfers of devices 544B and 544C are performed in a manner similar to that of devices 544A. Devices 544B and 544C are examples of device 144.

In summary, method 500 includes four mass-transfer steps conducted using LIFT. Each of these LIFT steps may utilize sequential transfer, simultaneous transfer, or hybrid transfer, as discussed above. The use of LIFT is particularly advantageous for the transfers of devices 544B and 544C to receiver substrate 530, where previously transferred devices (e.g., devices 544A) are already protruding from receiver substrate 530. These protruding devices may present a challenge to bond-release-type laser lift-off.

Method 500 may further include curing pads 122 after completion of LIFT of pads 122 and devices 544A, 544B, and 544C to receiver substrate 530. Method 500 may utilize curing techniques similar to those discussed above in reference to method 100.

Figure 6:
FIG. 6 illustrates a LIFT method for transferring some of the microelectronic devices to the receiver substrate in the method of FIGS. 5A and 5B, according to an embodiment.
Figure 6:
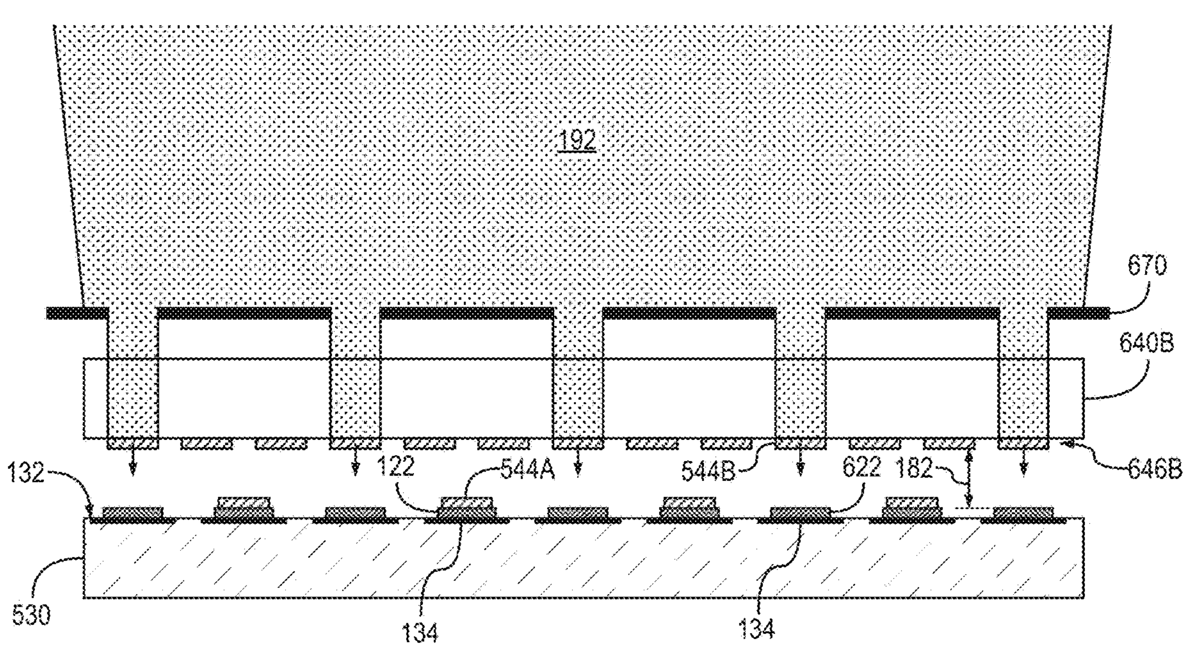

FIG. 6 illustrates one LIFT method 600 for transferring devices 544B to receiver substrate 530 in method 500. Method 600 uses a donor substrate 640B overlaid with an array 646B of devices 544B. Method 600 transfers some but not all of devices 544B to corresponding unoccupied pads 622 on receiver substrate 530. Receiver substrate 530 already contains several devices 544A. Gap 182 ensures that devices 544B on donor substrate 640B do not interfere with devices 544A. The use of LIFT, as opposed to bond-release laser lift-off, allows for donor substrate 640B to have a higher density of devices 544B than needed on receiver substrate 530. The higher density of devices 544B on donor substrate 640B is typically preferred to minimize the cost of fabricating each device.

As shown in FIG. 6, method 600 relies on the simultaneous-transfer technique to transfer a plurality of devices 544B at the same time. In the depicted example, laser beam 192 is a large laser beam masked by a mask 670 to only expose the devices 544B selected for transfer. Alternatively, method 600 may rely on sequential transfer or hybrid transfer. In embodiments of method 600 relying on sequential transfer, the use of LIFT, as opposed to bond-release laser lift-off allows for (a) array 646B having a higher density of devices 544B than needed on receiver substrate 530 and/or (b) the to-be-transferred devices 544B being arranged on donor substrate 640B in a pattern that does not align with the corresponding pads 122 on receiver substrate 530.

Referring again to FIGS. 5A and 5B, the depicted embodiment of method 500 may be generalized to other configurations. For example, the shapes of contacts 134, pads 122, and devices 544A, 544B, and 544C may be different from those depicted. In addition, devices 544A, 544B, and 544C may be arranged differently. In the depicted example, devices 544A, 544B, and 544C are arranged to form identical device-groups 550 on receiver substrate 530. Each group 550 contains two devices 544A, one device 544B, and one device 544C. Other combinations and arrangements are possible, with or without repeating identical device-groups. The device-group arrangement shown in diagram 505 is well-suited for forming color pixels in a microLED display. For example, devices 544A, 544B, and 544C may be green, red, and blue microLEDs, respectively. Method 500 may also be generalized to LIFT of two, four, or more than four different types of microelectronic devices from different respective donor substrates.

Figure 7:
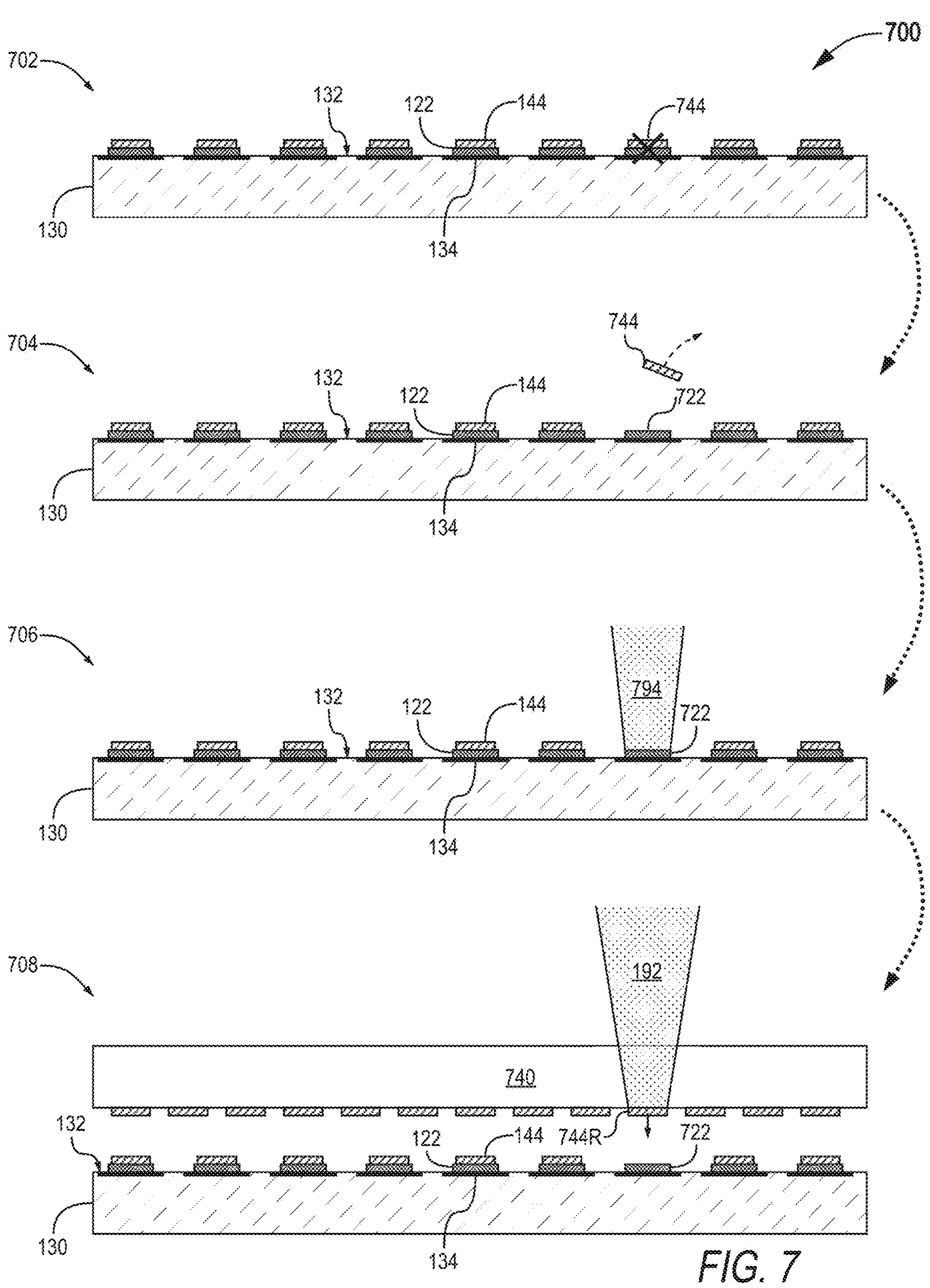
FIG. 7 illustrates a repair method that may be used to replace a microelectronic device in an array of microelectronic devices initially deposited using the method of FIG. 1, according to an embodiment.

FIG. 7 illustrates one repair method 700 that may be used to replace a microelectronic device in an array of microelectronic devices initially deposited using method 100. Method 700 may be an addition to method 100 or method 500, performed after curing of pad(s) 122 and/or testing devices 144 in situ on receiver substrate 130. Method 700 is illustrated in FIG. 7 by diagrams 702, 704, 706, and 708. Diagram 702 shows a receiver substrate 130 having an array of devices 144 disposed on each pad 122. One of devices 144, labeled 744, is to be replaced. Device 744 is, for example, a faulty device.

Method 700 first removes device 744 from its pad 122, as shown in diagram 704. Method 700 may pick off device 744 after selective heating and thereby softening of its pad 122. Next, if necessary, the now unoccupied pad 722 is heated with a laser beam 794 in order to soften the material thereof, or unoccupied pad 722 may be replaced or supplemented with additional conductive-paste material. A replacement microelectronic device 744R is transferred from a donor substrate 740 to the unoccupied pad 722. This transfer of replacement device 744R is performed using LIFT, in the same manner as the transfer of device 144 from donor substrate 140 to receiver substrate 130 discussed in reference to method 100 and diagrams 106 and 108 of FIG. 1.

Donor substrate 740 may contain an array of devices, as shown in FIG. 7. Only one of these devices, device 744R, is to be transferred to receiver substrate 130. As compared to bond-release laser lift-off, the use of LIFT in method 700 avoids interference between existing devices 144 on receiver substrate 130 and devices on donor substrate 740.

The present disclosure is described above in terms of a preferred embodiment and other embodiments. The invention is not limited, however, to the embodiments described and depicted herein. Rather, the invention is limited only by the claims appended hereto.

What is claimed is:

1. A laser transfer method, comprising steps of:

transferring a pad of conductive paste from a conductive-paste layer on a first donor substrate to a receiver substrate by laser-induced forward transfer; and transferring a microelectronic device from a second donor substrate to the pad of conductive paste on the receiver substrate by laser-induced forward transfer.

2. The method of claim 1, wherein the step of transferring the microelectronic device includes:

arranging the second donor substrate such that (a) the microelectronic device faces the pad of conductive paste on the receiver substrate and (b) a first gap exists between the microelectronic device and the pad of conductive paste prior to the laser-induced forward transfer; and directing a first laser beam through the second donor substrate onto the microelectronic device, to release the microelectronic device from the second donor substrate and propel the microelectronic device across the gap onto the pad of conductive paste on the receiver substrate, thereby effecting the laser-induced forward transfer.

3. The method of claim 2, wherein the step of transferring the pad includes:

arranging the first donor substrate such that (a) the conductive-paste layer faces a receiving surface of the receiver substrate and (b) a second gap exists between the conductive-paste layer and the receiving surface; and directing a second laser beam through the first donor substrate onto the conductive-paste layer, to release a portion of the conductive-paste layer from the first donor substrate and force the portion of the conductive-paste layer across the gap onto the receiving surface to form the pad of conductive paste thereon.

4. The method of claim 1, wherein the microelectronic device is a micro-light-emitting-diode.

5. The method of claim 4, wherein the receiver substrate is a display backplane.

6. The method of claim 1, wherein the conductive paste includes metal particles and a solvent.

7. The method of claim 6, wherein the metal particles include silver.

8. The method of claim 1, wherein the pad of conductive paste is not subjected to reflow between the steps of transferring the pad and transferring the microelectronic device.

9. The method of claim 1, further comprising keeping a temperature of the pad of conductive paste below a reflow temperature thereof between the transferring steps.

10. The method of claim 9, wherein the same laser apparatus is used to perform the laser-induced forward transfers of both transferring steps.

11. The method of claim 10, the laser-induced forward transfers of each transferring step being performed in a chamber of the laser apparatus, the method further comprising keeping the receiver substrate in the chamber between the two transferring steps.

12. The method of claim 1, further comprising keeping the pad of conductive paste at a temperature below 100 degrees Celsius between the transferring steps.

13. The method of claim 1, wherein the same laser source is used to perform the laser-induced forward transfers of both transferring steps.

14. The method of claim 1, further comprising a step of heating the pad of conductive paste, after the step of transferring the microelectronic device, so as to cure the pad of conductive paste.

15. The method of claim 1, wherein the receiver substrate includes an electrical contact, and the step of transferring the pad deposits the pad of conductive paste in physical contact with the electrical contact.

16. The method of claim 1, wherein the microelectronic device has a smaller footprint than the pad of conductive paste on the receiver substrate and is located entirely inside a perimeter of the pad of conductive paste.

17. The method of claim 1, wherein the pad of conductive paste, after the laser-induced forward transfer to the receiver substrate, has a thickness in the range between 2 and 20 micrometers.

18. The method of claim 1, wherein the conductive-paste layer on the first donor substrate has a thickness in the range between 5 and 25 micrometers.

19. The method of claim 1, wherein the laser-induced forward transfer in the step of transferring the microelectronic device propels the microelectronic device across a gap of at least 50 micrometers.

20. A mass transfer method, comprising:

repeatedly performing the step of transferring a pad, of claim 1, to transfer a plurality of pads of conductive paste from the conductive-paste layer on the first donor substrate to an array of respective locations on the receiver substrate; and repeatedly performing the step of transferring a microelectronic device, of claim 1, to transfer each of a plurality of microelectronic devices from the second donor substrate to a respective one of the pads of conductive paste on the receiver substrate.

* * * * *